(12) United States Patent
Yomori et al.

(10) Patent No.: US 10,475,829 B2
(45) Date of Patent: Nov. 12, 2019

(54) SEMICONDUCTOR APPARATUS AND EQUIPMENT

(71) Applicant: CANON KABUSHIKI KAISHA, Tokyo (JP)

(72) Inventors: Mitsuhiro Yomori, Tama (JP); Takehito Okabe, Yokohama (JP); Nobuaki Kakinuma, Tokyo (JP); Takashi Okagawa, Sagamihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/027,151

(22) Filed: Jul. 3, 2018

(65) Prior Publication Data

US 2019/0019825 A1    Jan. 17, 2019

(30) Foreign Application Priority Data

Jul. 11, 2017   (JP) .................................. 2017-135607

(51) Int. Cl.
*H01L 27/146*    (2006.01)
(52) U.S. Cl.
CPC .... *H01L 27/14614* (2013.01); *H01L 27/1462* (2013.01); *H01L 27/14636* (2013.01)
(58) Field of Classification Search
CPC .......... H01L 27/14614; H01L 27/1462; H01L 27/14636
See application file for complete search history.

(56) References Cited

U.S. PATENT DOCUMENTS

| 5,780,333 | A | * | 7/1998 | Kim | ................... H01L 27/0688 438/238 |
| 2004/0183157 | A1 | * | 9/2004 | Wada | ................. H01L 27/0629 257/538 |
| 2005/0020021 | A1 | | 1/2005 | Fujiwara | |
| 2007/0018327 | A1 | | 1/2007 | Fujiwara | |
| 2007/0296003 | A1 | * | 12/2007 | Park | ................. H01L 29/42384 257/288 |

(Continued)

FOREIGN PATENT DOCUMENTS

| JP | 2006-222410 A | 8/2006 |
| JP | 2008-227061 A | 9/2008 |
| JP | 2013-105765 A | 5/2013 |

*Primary Examiner* — Victor A Mandala
(74) *Attorney, Agent, or Firm* — Canon USA, INC., IP Division

(57) ABSTRACT

A semiconductor apparatus includes a conductive member including a polycrystalline silicon layer having a first, second and third portions, an interlayer insulation film that covers the conductive member, a first silicon nitride layer arranged between the interlayer insulation film and the third portion, a second silicon nitride layer arranged between the interlayer insulation film and the first portion and between the interlayer insulation layer and the second portion, a first contact plug disposed above the first portion and penetrating the interlayer insulation film and the second silicon nitride layer to connect to the conductive member, and a second contact plug disposed above the second portion and penetrating the interlayer insulation film and the second silicon nitride layer to connect to the conductive member. The first silicon nitride layer is disposed between the first and second contact plugs, and apart from the first and second contact plugs.

20 Claims, 4 Drawing Sheets

(56) References Cited

U.S. PATENT DOCUMENTS

| | | | |
|---|---|---|---|
| 2008/0157219 A1 | 7/2008 | Fujiwara | |
| 2008/0258197 A1* | 10/2008 | Coolbaugh | H01L 29/94 257/303 |
| 2009/0090977 A1* | 4/2009 | Freeman | H01L 21/28088 257/379 |
| 2010/0078645 A1* | 4/2010 | Kurz | H01L 21/84 257/66 |
| 2012/0098071 A1* | 4/2012 | Aggarwal | H01L 27/0629 257/369 |
| 2013/0149849 A1* | 6/2013 | Nandakumar | H01L 21/26513 438/532 |
| 2013/0181307 A1* | 7/2013 | Ohta | H01L 31/1136 257/431 |
| 2013/0200466 A1* | 8/2013 | Zhao | H01L 27/0629 257/380 |
| 2015/0349045 A1* | 12/2015 | Wang | H01L 21/02595 257/380 |
| 2017/0040462 A1* | 2/2017 | Lu | H01L 29/78618 |
| 2019/0103420 A1* | 4/2019 | Liu | H01L 27/1259 |

* cited by examiner

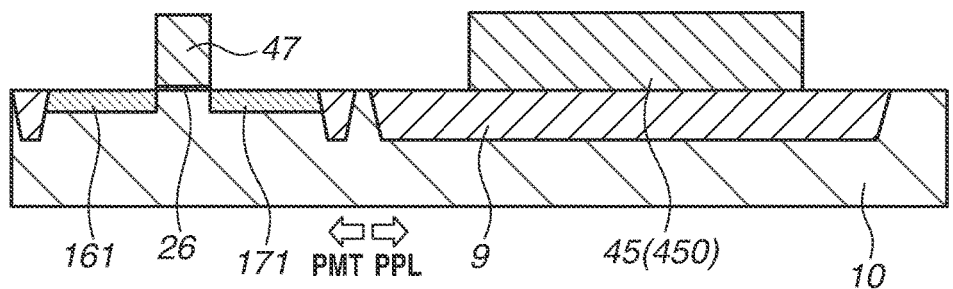
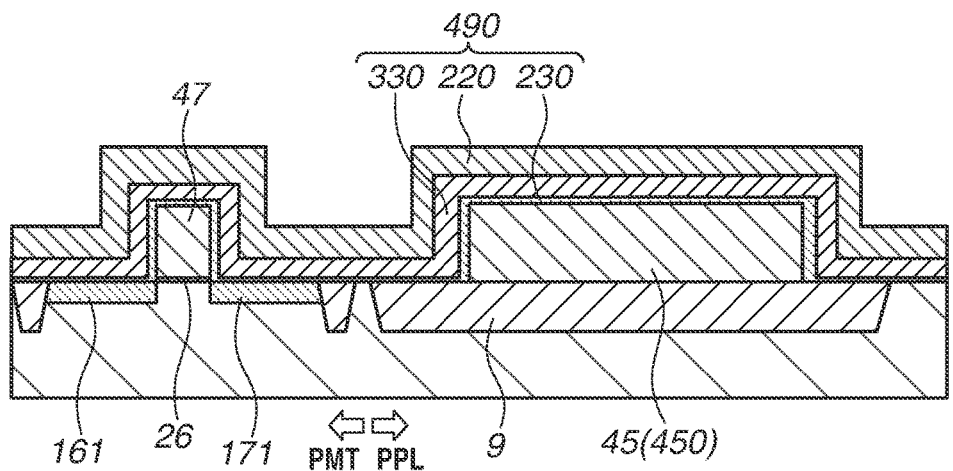
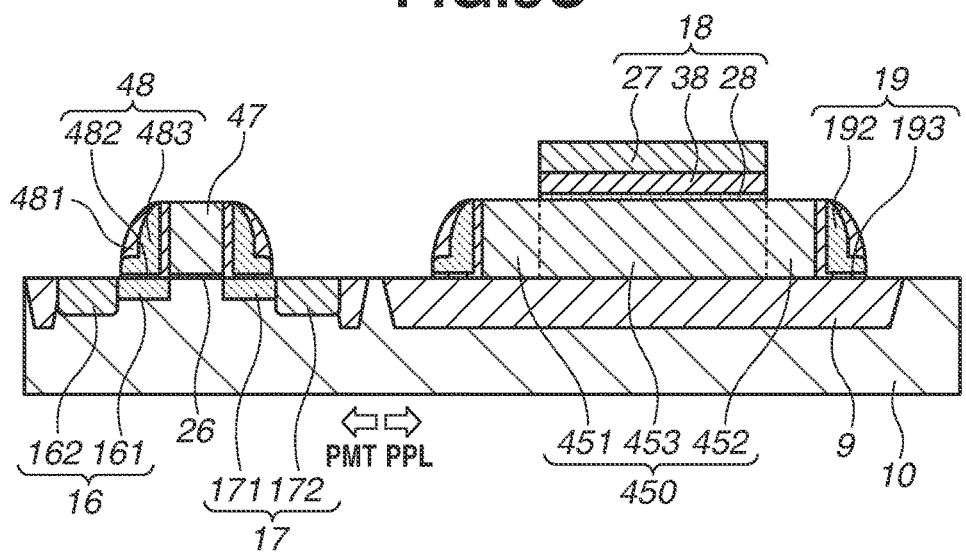

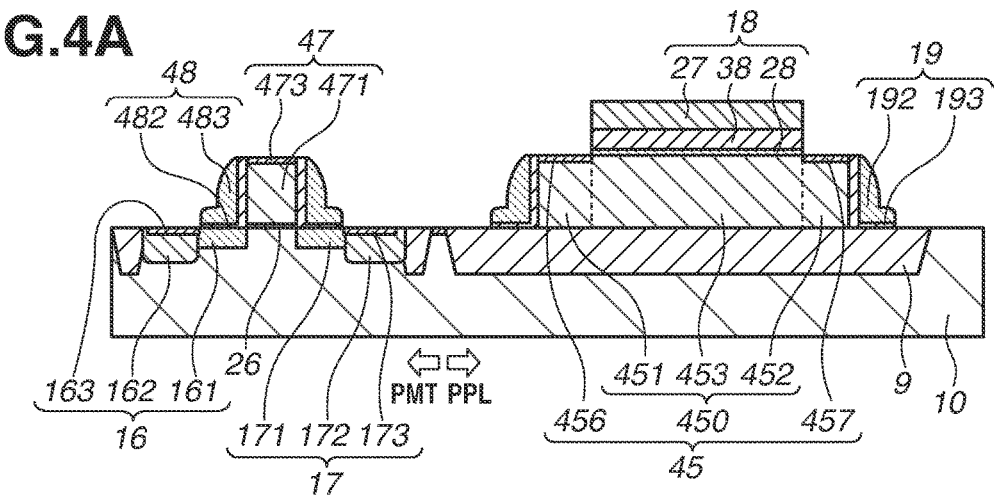
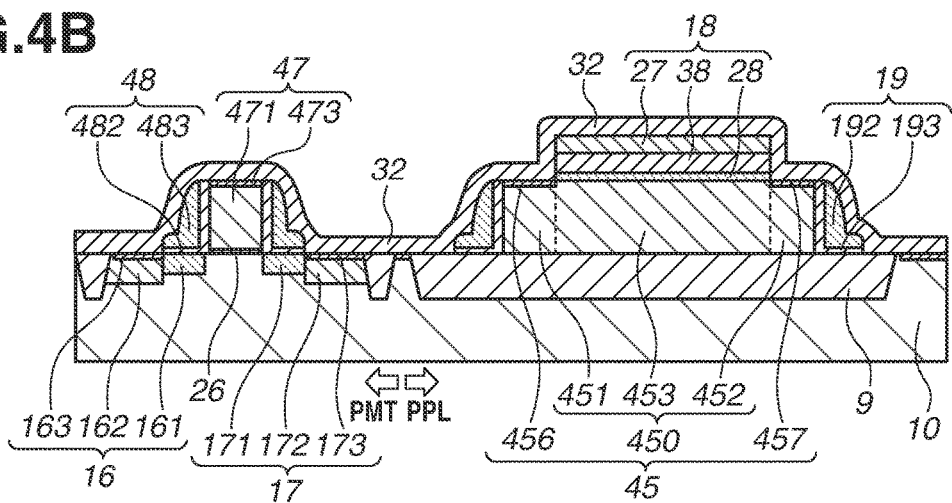
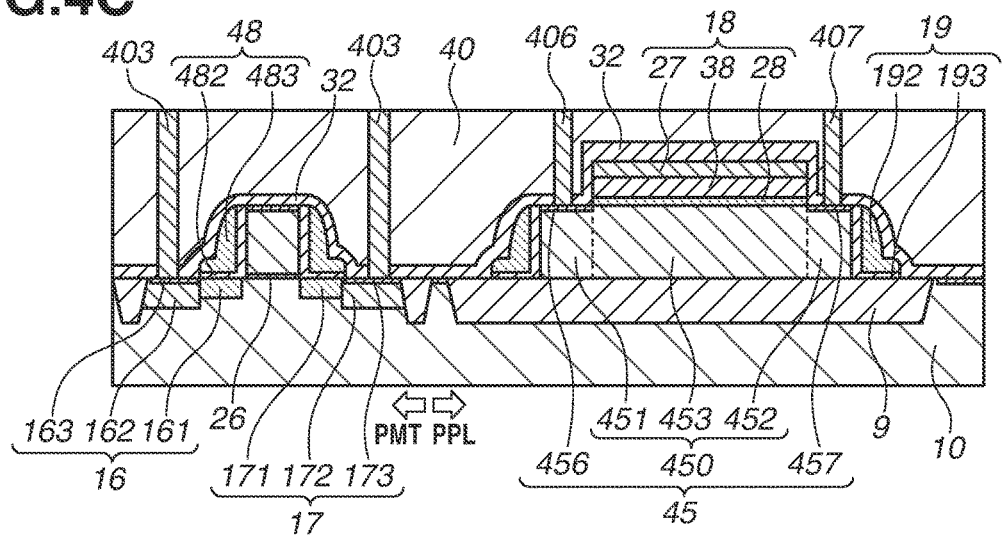

SEMICONDUCTOR APPARATUS AND EQUIPMENT

BACKGROUND

Field of the Disclosure

The present disclosure generally relates to a semiconductor apparatus.

Description of the Related Art

In a semiconductor apparatus, polycrystalline silicon is used as a resistor or wiring. A technique for improving stability of a resistor value by arranging silicon nitride above a polycrystalline silicon resistor is discussed in Japanese Patent Application Laid-Open No. 2008-227061 and Japanese Patent Application Laid-Open No. 2006-222410. In the technique discussed in Japanese Patent Application Laid-Open No. 2006-222410, two nitride films, i.e., a first nitride film 29 and a third nitride film 43, are disposed above a resistor element 21 including a polycrystalline silicon pattern. Further, in the technique discussed in Japanese Patent Application Laid Open No. 2006-222410, contact holes for electric connection are formed on an interlayer insulation film 27 and a first nitride film 29. When the contact holes are formed through the technique discussed in Japanese Patent Application Laid-Open No. 2006-222410, etching has to be applied on the two nitride films, i.e., the first nitride film 29 and the third nitride film 43. This degrades reliability of the electric connection to the polycrystalline silicon pattern, and eventually degrades reliability of the semiconductor apparatus.

SUMMARY

The present disclosure is directed to a technique for improving the reliability of the semiconductor apparatus. According to an aspect of the present disclosure, a semiconductor apparatus includes a semiconductor substrate, a conductive member which is arranged above the semiconductor substrate, and includes a polycrystalline silicon layer consisting of a first portion, a second portion, and a third portion between the first and the second portions in a direction extending along a main surface of the semiconductor substrate, an interlayer insulation film that covers the conductive member, a first silicon nitride layer arranged between the interlayer insulation film and the third portion, a second silicon nitride layer arranged between the interlayer insulation film and the first portion, and a position between the interlayer insulation layer and the second portion, a first contact plug disposed above the first portion, the first contact plug penetrating the interlayer insulation film and the second silicon nitride layer to connect to the conductive member, and a second contact plug disposed above the second portion, the second contact plug penetrating the interlayer insulation film and the second silicon nitride layer to connect to the conductive member, wherein the first silicon nitride layer is disposed between the first contact plug and the second contact plug in the direction, and is apart from the first contact plug and the second contact plug.

Further features will become apparent from the following description of exemplary embodiments with reference to the attached drawings.

BRIEF DESCRIPTION OF THE DRAWINGS

FIGS. 3A, 3B, and 3C are diagrams illustrating a manufacturing method of a semiconductor apparatus.

FIGS. 4A, 4B, and 4C are diagrams illustrating a manufacturing method of a semiconductor apparatus.

DESCRIPTION OF THE EMBODIMENTS

Figure 1A:
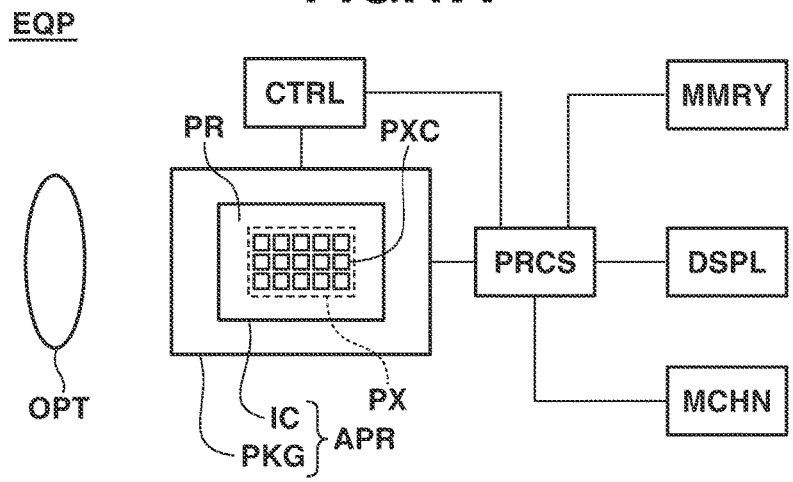
FIGS. 1A and 1B are diagrams illustrating a semiconductor apparatus.

Hereinafter, an exemplary embodiment will be described with reference to the appended drawings. In the exemplary embodiment and drawings described below, a common reference numeral is applied to a common configuration in a plurality of drawings. Therefore, the common configuration will be described while referring to the plurality of drawings mutually, and description will be omitted as appropriate with respect to the configuration to which the common reference numeral is applied. Further, configurations having a similar name with different reference numerals can be distinguished or referred to as a first configuration, second configuration, a third configuration, and so on.

<Semiconductor Apparatus>

FIG. 1A is a diagram schematically illustrating an equipment EQP having a semiconductor apparatus APR according to an exemplary embodiment. The semiconductor apparatus APR includes a semiconductor device IC. The semiconductor device IC is a semiconductor chip on which a semiconductor integrated circuit is arranged. The semiconductor apparatus APR may include a package PKG for holding the semiconductor device IC in addition to the semiconductor device IC. For example, the semiconductor apparatus APR of the present exemplary embodiment may be a photoelectric conversion apparatus which can be used as an image sensor, an auto focus (AF) sensor, a light-metering sensor, or a range-finding sensor. The semiconductor apparatus APR according to aspects of the present disclosure is also applicable to an arithmetic device, a storage device, a communication device, a mechanical-electric device, or a display device in addition to the photoelectric conversion apparatus.

The semiconductor device IC includes a pixel area PX in which pixel circuits PXC having photoelectric conversion portions are arrayed in a two-dimensional state. The semiconductor device IC can arrange a peripheral area PR in a circumferential area of the pixel area PX. Further, a driving circuit for driving the pixel circuit PXC, a signal processing circuit for processing a signal from the pixel circuit PXC, and a control circuit for controlling the driving circuit or the signal processing circuit can be arranged in the peripheral area PR. The signal processing circuit can execute processing such as correlated double sampling (CDS) processing, amplification processing, or analog-digital (A/D) conversion processing. As another example of the semiconductor device IC, at least a part of the peripheral circuit that is arranged in the peripheral area PR may be arranged on a semiconductor chip different from the semiconductor chip on which the pixel area PX is arranged, and both of the semiconductor chips may be stacked one above the other.

The equipment EQP further includes at least one of an optical system OPT, a control device CTRL, a processing device PRCS, a display device DSPL, a storage device MMRY, and a mechanical device MCHN. The equipment EQP will be described below in detail.

Figure 1B:
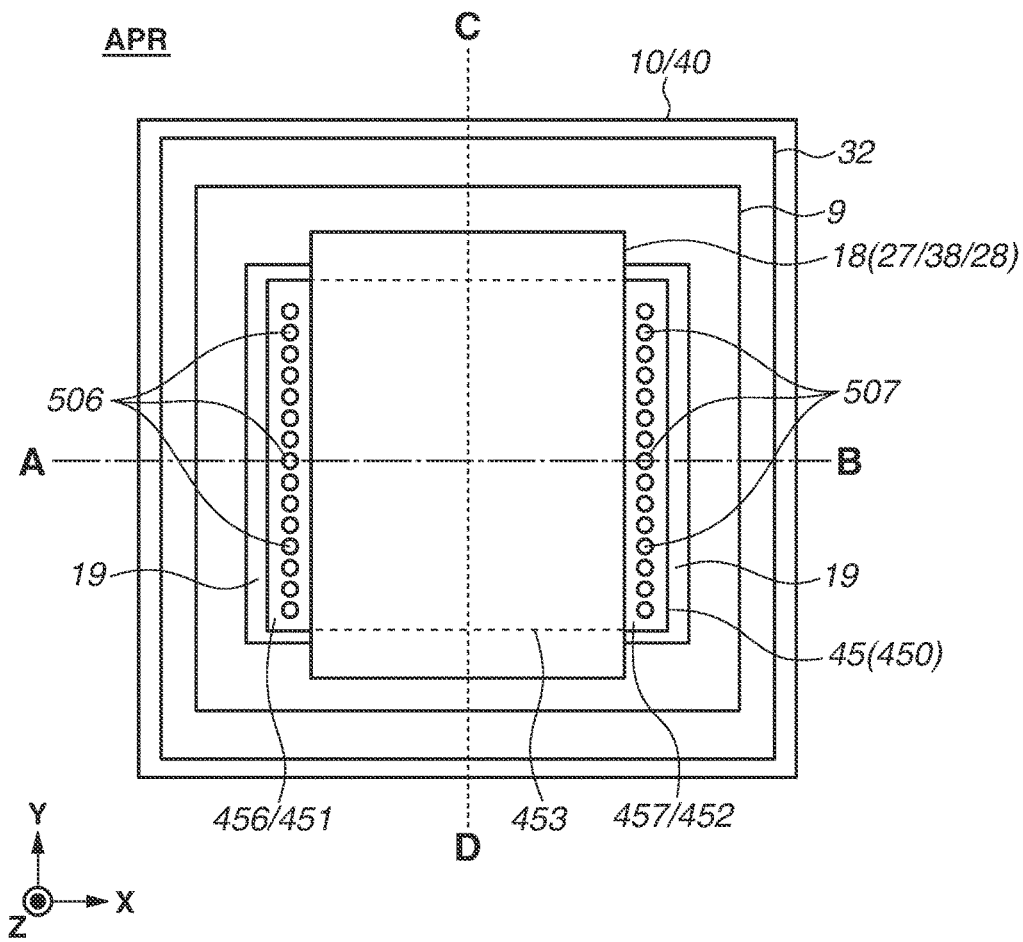
Figure 2A:
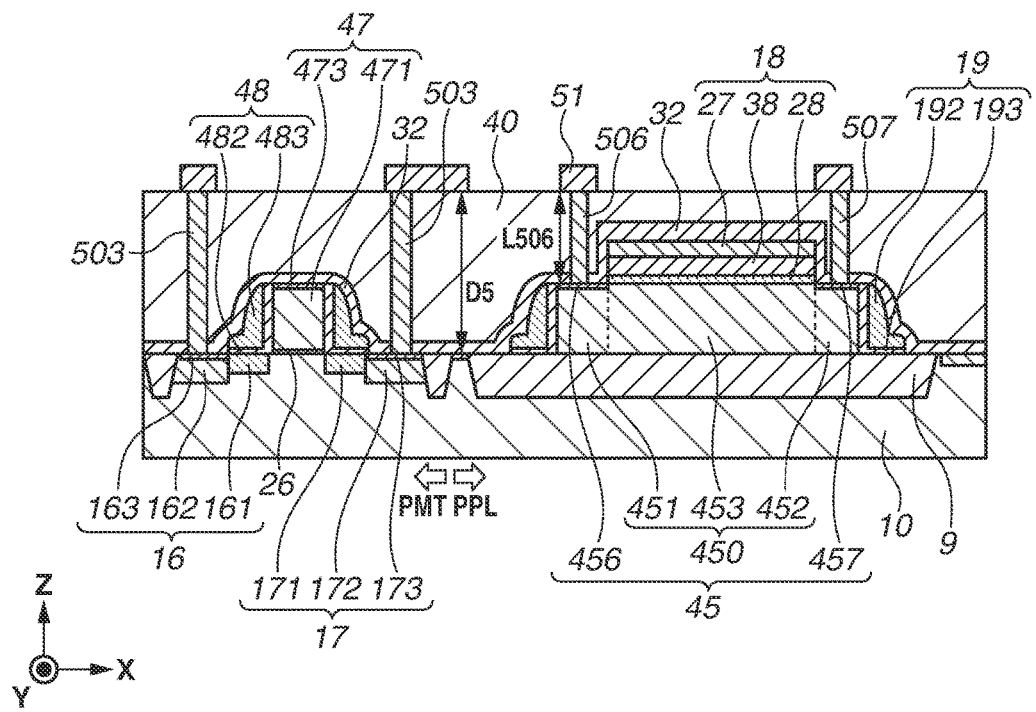
FIGS. 2A and 2B are diagrams illustrating a semiconductor apparatus.
Figure 2B:
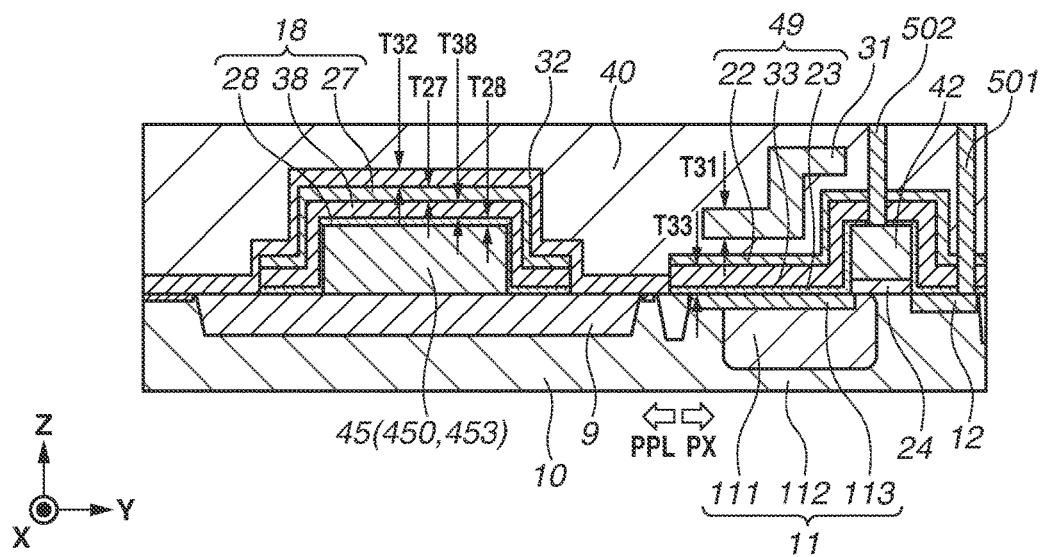

FIG. 1B is a diagram schematically illustrating a plan view of a part of the semiconductor apparatus APR. FIG. 2A is a diagram schematically illustrating a cross-sectional view of the semiconductor apparatus APR including a portion taken along a line A-B in FIG. 1B, and FIG. 2B is a diagram schematically illustrating a cross-sectional view including a portion taken along a line C-D in FIG. 1B. Hereinafter, FIGS. 1B, 2A, and 2B will be described collectively. A column direction in which pixels are arrayed in pixel columns in the pixel area PX is set as an X-direction, a row direction in which pixels are arrayed in pixel rows in the pixel area PX is set as a Y-direction, and a thickness direction which represents a thickness of a layer or a film is set as a Z-direction. The X-direction, the Y-direction, and the Z-direction intersect with each other in this example, the X, Y, and Z-directions are orthogonal to each other).

The present exemplary embodiment is characterized by a positional relationship between members (layers or films) consisting of a silicon nitride material. Members described as different members, which consist of the silicon nitride material respectively, are either members having another member consisting of different material therebetween or members consisting of similar materials in different compositions. The same can be also said for members consisting of a silicon oxide material. A film refers to a member that is continuous in a plane, whereas a layer refers to a member that may be non-continuous in a plane. In the below-described exemplary embodiment, "silicon nitride" refers to a chemical compound of nitrogen (N) and silicon (S), which are other than light elements (i.e., hydrogen (H) and helium (He)), and stand at top two with respect to the composition ratio as the constituent elements. Silicon nitride can contain light element such as hydrogen (H), and its amount (atomic percent (at. %)) may be greater or less than that of nitrogen (N) or silicon (Si). Silicon nitride can contain an element other than nitrogen (N), silicon (Si), hydrogen (H), and. helium (He) at a concentration lower than that of nitrogen (N) or silicon (Si). Boron (B), carbon (C), oxygen (O), fluorine (F), phosphorus (P), chlorine (Cl), and argon (Ar) may be typical elements which can be contained in silicon nitride. Of the constituent elements of silicon nitride, if a constituent element other than the light elements that stands at the third highest composition ratio is oxygen, this silicon nitride can referred to as "silicon oxynitride" or "oxygen-containing silicon nitride". An element contained in the constituent member of the semiconductor apparatus APR can he analyzed through energy dispersive X-ray spectrometry (EDX). Similarly, "silicon oxide" refers to a chemical compound of oxygen (O) and silicon (S), which are other than light elements and stand at top two with respect to the composition ratio of the constituent elements Silicon oxide can contain an element other than oxygen (O) and silicon (Si) at a concentration lower than that of oxygen (O) or silicon (Si).

The semiconductor apparatus APR includes an element portion PPL including a conductive member 45. In the above-described semiconductor apparatus APR as a photoelectric conversion apparatus, while the element portion PPL can be arranged in the peripheral area PR, the element portion PPL can also be arranged in the pixel area PX. The conductive member 45 is used as a passive element such as a resistor, wiring, or a capacitance of an integrated circuit. It is preferable that he conductive member 45 in the present exemplary embodiment be used as a resistor.

The semiconductor apparatus APR includes a semiconductor substrate 10, a conductive member 45, an interlayer insulation film 40, silicon nitride layers 32 and 38, and contact plugs 506 and 507. The X-direction and the Y-direction are directions extending along a main surface of the semiconductor substrate 10.

The semiconductor apparatus APR serving as a photoelectric conversion apparatus can include a photoelectric conversion portion 11 and a pixel transistor arranged on the semiconductor substrate 10 in the pixel area PX. For example, as illustrated in FIG. 2B, the pixel transistor is a metal-oxide semiconductor (MOS) transistor including a gate electrode 42. The semiconductor apparatus APR includes a peripheral transistor arranged on the semiconductor substrate 10 in the peripheral area PR. The peripheral transistor is, for example, a MOS transistor including a gate electrode 47 as illustrated in FIG. 2A. A portion in which the peripheral transistor is arranged is referred to as a peripheral transistor portion PMT. In addition, the semiconductor apparatus APR as a photoelectric conversion apparatus may be front-face illumination type a back-face illumination type semiconductor apparatus. A main face of the semiconductor substrate 10 is, of the front face and the back face of the semiconductor substrate 10, a face including a boundary face with the gate insulation film of the MOS transistor.

The conductive member 45 is arranged above (i.e. on the upper side of) the semiconductor substrate 10. The conductive member 45 includes a polycrystalline silicon layer 450. While the polycrystalline silicon layer 450 of the present exemplary embodiment is a P-type polycrystalline silicon layer containing boron, the polycrystalline silicon layer 450 may be an N-type polycrystalline silicon layer containing impurity other than boron. The polycrystalline silicon layer 450 includes a first portion 451, a second portion 452, and a third portion 453 between the first portion 451 and the second portion 452 in the X-direction. A width of the third portion 453 in the X-direction can be greater than a width of the first portion 451 in the X-direction or a width of the second portion 452 in the X-direction. A width of the third portion 453 in the Y-direction can be equivalent to a width of the first portion 451 in the Y-direction or a width of the second portion 452 in the Y-direction.

The interlayer insulation film 40 covers the conductive member 45. In addition, the interlayer insulation film 40 covers also the peripheral transistor or the pixel transistor. While the photoelectric conversion portion 11 is also covered with the interlayer insulation film 40, an opening may be provided on the interlayer insulation film 40 arranged above (i.e. on the upper side of) the photoelectric conversion portion 11, and a dielectric material such as a silicon nitride material, a silicon oxide material, or a resin material may be embedded to that opening.

The silicon nitride layer 38 is arranged at a position between the interlayer insulation film 40 and the third portion 453. A thickness T38 of the silicon nitride layer 38 may be, for example, 10 to 100 nm.

The silicon nitride layer 32 is arranged between the interlayer insulation film 40 and the first portion 451, and between the interlayer insulation film 40 and the second portion 452. The silicon nitride layer 32 includes a first area arranged between the interlayer insulation film 40 and the first portion 451, and a second portion arranged between the interlayer insulation film 40 and the second portion 452. In the present exemplary embodiment, the silicon nitride layer 32 is also arranged between the interlayer insulation film 40 and the third portion 453. In other words, the silicon nitride layer 32 includes a third area arranged between the interlayer insulation film 40 and the third portion 453. The first area and the second area of the silicon nitride layer 32 are arranged continuously via the third area. The silicon nitride layer 32 of the present exemplary embodiment is in contact with the conductive member 45. a thickness T32 of the silicon nitride layer 32 is, for example, 10 to 100 nm. While the silicon nitride layer 38 is disposed between the silicon nitride layer 32 and the conductive member 45 in the present exemplary embodiment, the silicon nitride layer 32 may be disposed between the silicon nitride layer 38 and the conductive member 45.

A silicon oxide layer 28 is arranged between the silicon nitride layer 38 and the third portion 453. A silicon oxide layer 27 is arranged between the silicon nitride layer 38 and the silicon nitride layer 32. A laminated film including the silicon oxide layer 27, the silicon nitride layer 38, and the silicon oxide layer 28 is referred to as an insulation film 18. The silicon oxide layer 28 is in contact with the third portion 453 of the conductive member 45. A thickness T28 of the silicon oxide layer 28 is, for example, 5 to 25 nm.

A thickness T27 of the silicon oxide layer 27 is, for example, 10 to 100 nm. The thickness T28 of the silicon oxide layer 28 can be thinner than the thickness T27 of the silicon oxide layer 27 (T28<T27). Therefore, a distance between the silicon nitride layer 38 and the third portion 453 corresponding to the thickness T28 is shorter than a distance between the silicon nitride layer 38 and the silicon nitride layer 32 in the third area corresponding to the thickness T27. By reducing the distance between the silicon nitride layer 38 and the conductive member 45, the conductive member 45 can be protected by the silicon nitride layer 38, and thus reliability thereof is improved. It is preferable that the distance between the silicon nitride layer 32 in the first or the second area and the conductive member 45 be shorter than the distance between the silicon nitride layer 38 and the third portion 453. In the present exemplary embodiment, a distance between the silicon nitride layer 32 and the conductive member 45 is zero because the silicon nitride layer 32 in the first or the second area is in contact with the conductive member 45.

As described below in detail, in order that the silicon nitride layer 38 itself shows practical functionality, it is preferable that the silicon nitride layer 38 be in a thickness of a certain degree and in close contact with the conductive member 45. Therefore, the thickness 138 of the silicon nitride layer 38 can be greater than the thickness 128 of the silicon oxide layer 28 (T28<T38). The silicon oxide layer 28 can have a function as a buffer layer that reduces an influence of stress of the silicon nitride layer 38 to be applied on the conductive member 45. The thickness 138 of the silicon nitride layer 38 can be greater than the thickness 127 of the silicon oxide layer 27 (T38>T27). Accordingly, for example, a relationship between the thicknesses of respective layers constituting the insulation film 18 can be expressed as "T28<T27<T38".

The contact plug 506 is a conductive member arranged in a hole (contact hole) that penetrates the interlayer insulation film 40 and the silicon nitride layer 32 in the first area. The contact plug 506 is disposed above (i.e. on the upper side of) the first portion 451 and penetrates the interlayer insulation film 40 and the silicon nitride layer 32 in the first area to connect to the conductive member 45. Therefore, the contact plug 506 is in contact with the interlayer insulation film 40 and the silicon nitride layer 32 in the first area. A plurality of contact plugs including the contact plug 506 penetrate the interlayer insulation film 40 and the silicon nitride layer 32 in the first area to connect to the conductive member 45. The plurality of contact plugs are disposed above (i.e. on the upper side of) the first portion 451 and arrayed in the Y-direction.

The contact plug 507 is a conductive member arranged in hole (contact hole) that penetrates the interlayer insulation film 40 and the silicon nitride layer 32 in the second area. The contact plug 507 is disposed above (i.e. on the upper side of) the second portion 452 and penetrates the interlayer insulation film 40 and the silicon nitride layer 32 in the second area to connect to the conductive member 45. Therefore, the contact plug 507 is in contact with the interlayer insulation film 40 and the silicon nitride layer in the second area. A plurality of contact. plugs including the contact plug 507 penetrate the interlayer insulation film 40 and the silicon nitride layer 32 in the second area to connect to the conductive member 45. The plurality of contact plugs are disposed above (i.e. on the upper side of) the second portion 452 and arrayed in the Y-direction.

The contact plugs 506 and 507 are conductive members including a barrier metal such as titanium nitride and a conductive material such as tungsten. Typically, the barrier metals of the contact plugs 506 and 507 are in contact with the interlayer insulation film 40 and the silicon nitride layer 32.

Electric pathways are formed from the contact plug 506 to the first portion 451, from the first portion 451 to the third portion 453, from the third portion 453 to the second portion 452, and from the second portion 452 to the contact plug 507. With this configuration, the third portion 453 mainly functions as a resistor or wiring.

A width of the silicon nitride layer 38 in the X-direction is smaller than a width of the conductive member 45 in the X-direction. In the present exemplary embodiment, the width of the silicon nitride layer 38 in the X-direction is equal to the width of the third portion 453 of the conductive member 45 in the X-direction. Then, the silicon nitride layer 38 is disposed between the contact. plug 506 and the contact plug 507 in the X-direction. Therefore, the silicon nitride layer 38 is apart (separated) from the contact plugs 506 and 507. In other words, both ends (left and right ends) of the silicon nitride layer 38 in the X-direction are disposed between the contact plugs 506 and 507. The both ends (left and right ends) of the silicon nitride layer 38 in the X-direction are extended in the Y-direction. The left end of the silicon nitride layer 38 in the X-direction is extended along a column of contact plugs including the contact plug 506, whereas the right end in the X-direction of the silicon nitride layer 38 is extended along a column of contact plugs including the contact plug 507. The silicon nitride layer 32 in the first area is disposed between the silicon nitride layer 38 and the contact plug 506 to cover the left end of the silicon nitride layer 38. Further, the silicon nitride layer 32 in the second area is disposed between the silicon nitride layer 38 and the contact plug 507 to cover the right end of the silicon nitride layer 38.

Since the silicon nitride layer 38 is arranged close to the conductive member 45, a characteristic of the conductive member 45 can be stabilized, so that reliability thereof is improved. One of its reasons is that the silicon nitride layer has a barrier characteristic higher than that of the silicon oxide layer, and thus the silicon nitride layer 38 acts as a protection layer for protecting the conductive member 45 from damage or contamination. Particularly, because metallic contamination of the conductive member 45 or diffusion of impurity (boron) from the conductive member 45 is likely to fluctuate resistance of the conductive member 45, it is effective to arrange the silicon nitride layer 38.

Because the silicon nitride layer 32 is arranged close to the conductive member 45, it is possible to improve reliability of a connection between the contact plugs 506 and 507 penetrating the silicon nitride layer 32, and the conductive member 45. The silicon nitride layer 38 is apart (separated) from the contact plugs 506 and 507, so that the contact plugs 506 and 507 penetrate only one of the silicon nitride layers 38 and 32 and are brought into contact only with the other. Typically, barrier metals of the contact plugs 506 and 507 are in contact with the interlayer insulation film 40 and the silicon nitride layer 32. In comparison to a case where each of the contact plugs 506 and 507 penetrates and is brought into contact with both of the silicon nitride layers 38 and 32, reliability of the connection between the contact plug 506 or 507 and the conductive member 45 can be improved. In the present exemplary embodiment, each of the contact plugs 506 and 507 penetrates and is in contact with only the silicon nitride layer 32, of the silicon nitride layers 38 and 32.

The reliability may also be improved because of hydrogen termination performed on a dangling-bond included in the conductive member 45. There is a case where each of the silicon nitride layers 32 and 38 acts as a hydrogen desorption body or a hydrogen shielding body depending on its film quality. In each case, by arranging the silicon nitride layers 32 and 38, a degree of hydrogen termination of the polycrystalline silicon layer 450 can be controlled. For example, a case where the silicon nitride layer 38 is disposed between the silicon nitride layer 32 and the conductive member 45 is considered. If the silicon nitride layer 32 is a hydrogen desorption body, excessive hydrogen supplied from the silicon nitride layer 32 to the conductive member 45 can be suppressed by making the silicon nitride layer 38 a hydrogen shielding body, so that the characteristic of the conductive member 45 can be stabilized. If the silicon nitride layer 38 is a hydrogen desorption body, supply of hydrogen to the conductive member 45 can be facilitated because the silicon nitride layer 32 suppresses hydrogen from being diffused outward from the silicon nitride layer 38, that the characteristic of the conductive member 45 can be stabilized. While it is possible to determine whether to use the silicon nitride layers 32 and 38 as the hydrogen desorption body or the hydrogen shielding body depending on the characteristic required for the conductive member 45, it is preferable that the silicon nitride layer 32 be used as the hydrogen desorption body and the silicon nitride layer 38 be used as the hydrogen shielding body. In this case, the hydrogen concentration of the silicon nitride layer 32 can be higher than hydrogen concentration of the silicon nitride layer 38.

A wiring layer 51 that is in contact with the contact plugs 506 and 507 is arranged above the interlayer insulation film 40. The wiring layer 51 is, for example, a copper wiring layer having a single damascene structure. However, the wiring layer 51 may be an aluminum wiring layer. A distance between the silicon nitride layer 32 and the conductive member 45 or a distance between the silicon nitride layer 38 and the conductive member 45, which corresponds to the thickness T28, is shorter than a distance D5 between the semiconductor substrate 10 and the wiring layer 51 (T28<D5) Further, a distance between the silicon nitride layer 38 and the conductive member 45 is shorter than a length L506 of the contact plug 506. A length of the contact plug 507 may be considered to be equal to the length L506 of the contact plug 506.

The conductive member 45 includes a silicide portion 456 arranged between the polycrystalline silicon layer 450 (the first portion 451) and the contact plug 506. The silicide portion 456 is extended and disposed between the silicon nitride layer 32 in the first area and the polycrystalline silicon layer 450 (the first portion 451). The conductive member 45 includes a silicide portion 457 arranged between the polycrystalline silicon layer 450 (the second portion 452) and the contact plug 507. The silicide portion 457 is extended and disposed between the silicon nitride layer 32 in the second area and the polycrystalline silicon layer 450 (the second portion 452). The silicon nitride layer 32 in the first area is in contact with the silicide portion 456, whereas the silicon nitride layer 32 in the second area is in contact with the silicide portion 457. Typically, barrier metals of the contact plugs 506 and 507 are in contact with the silicide portions 456 and 457 respectively. By providing the silicide portions 456 and 457, contact resistance between the contact plug 506 or 507 and the conductive member 45 can be reduced, so that variation in the resistance value of the conductive member can be reduced. Further, by extending the silicide portions 456 and 457 in the Y-direction, a resistance distribution in the conductive member 45 in the Y-direction can be reduced. Therefore, variation in resistance characteristics can be reduced. The third portion 453 of the polycrystalline silicon layer 450 is in contact with the insulation film 18. In the present exemplary embodiment, the third portion 453 is in contact with the silicon oxide layer 28. This means that a silicide portion is not present between the third portion 453 and the insulation film 18. In other words, the silicide portions 456 and 457 are not extended and disposed between the silicon nitride layer 38 and the polycrystalline silicon layer 450. With this configuration, drastic reduction of a resistance value of the conductive member 45 is suppressed, and thus the conductive member 45 can be appropriately used as a resistor.

A silicide material such as cobalt silicide, nickel silicide, tungsten silicide, or titanium silicide may be used for the silicide portion 456 or 457.

The silicon nitride layer 32 suppresses diffusion of metallic components of the silicide portions 456 and 457, so that contamination of the other elements can be reduced. Therefore, it is preferable that a distance between the silicon nitride layer 32 and the silicide portion 456 or 457 be shorter. In the present exemplary embodiment, a distance between the silicon nitride layer 32 and the conductive member 45 is zero. In the present exemplary embodiment, because the width of the silicon nitride layer in the X-direction is smaller than the width of the conductive member 45 in the X-direction, it is possible to bring the silicon nitride layer 32 close to the silicide portion 456 or 457.

An insulation member 9 thicker than the silicon nitride layer 38 is arranged between the conductive member and the semiconductor substrate 10, and the silicon nitride layer 32 is extended and disposed to cover an edge of the insulation member 9 in the X-direction. The insulation member is a member for element isolation having a shallow trench isolation (STI) structure or a local oxidation of silicon (LOCUS) structure, which is also referred to as a field oxide film. The insulation member 9 of the present exemplary embodiment is a silicon oxide member arranged on a dented groove formed on a main face of the semiconductor substrate 10. By arranging the thick insulation member 9 under the conductive member 45, capacity between the semiconductor substrate 10 and the conductive member 45 can be reduced.

A side wall 19 that covers the side faces on both sides in the X-direction of the polycrystalline silicon layer 450 is arranged above the insulation member 9. The side faces on both sides of the polycrystalline silicon layer 450 in the X-direction are configured of the first portion 451 and the second portion 452, and extended in the Y-direction. The side wall 19 includes a silicon nitride layer 193. The side wall 19 includes a silicon oxide layer 192 arranged at a position between the silicon nitride layer 193 and the polycrystalline silicon layer 450, and a position between the silicon nitride layer 193 and the insulation member 9 arranged on the semiconductor substrate 10. The silicon nitride layer 32 is in contact with the silicon nitride layer 193 of the side wall 19. The silicon nitride layer 38 is extended in the Y-direction to cover the side faces on both sides of the polycrystalline silicon layer 450 in the Y-direction. The side faces on both sides of the polycrystalline silicon layer 450 in the Y-direction is configured of the third portion 453, and extended in the Y-direction. Because the four side faces of the polycrystalline silicon layer 450 are covered with the side wall 19 or the insulation film 18 which includes the silicon nitride layer 193 or 38, it is possible to suppress hydrogen from penetrating from the side faces of the polycrystalline silicon layer 450, so that the resistance can be stabilized.

A peripheral transistor portion PMT is arranged in the peripheral area PR, The peripheral transistor portion PMT includes a gate electrode 47, a gate insulation film 26, a source 16, and a drain 17. The gate electrode 47 is arranged above the semiconductor substrate 10, and the gate insulation film 26 is arranged between the gate electrode 47 and the semiconductor substrate 10. The gate electrode 47 includes a polycrystalline silicon portion 471 and a metal containing portion 473. The source 16 includes a P-type low-concentration semiconductor area 161 as a lightly doped drain (LDD) area, a P-type medium-concentration semiconductor area 162, and a metal containing portion 163. Similarly, the drain 17 also includes a P-type low-concentration semiconductor area 171, a P-type medium-concentration semiconductor area 172, and a metal containing portion 173. The polycrystalline silicon portion 471 contains boron. In order not to lower resistivity of the polycrystalline silicon layer 450, it is preferable that the boron concentration of the polycrystalline silicon layer 450 be lower than the boron concentration of the polycrystalline silicon portion 471 of the gate electrode 47.

The metal containing portions 163, 173, and 473 are portions containing metal, which consist of a metal or a metallic compound. For example, the metal contained in the metal containing portion 163, 173, or 473 may be cobalt (Co), nickel (Ni), tantalum (Ta), or tungsten (W). Typically, the metal containing portion 163, 173, or 473 is a portion consisting of a semiconductor metal compound, more typically, the metal containing portion 163, 173, or 473 is a portion (silicide portion) consisting of a silicon metal compound, i.e., silicide. Preferably, silicide may he cobalt silicide, nickel silicide, tungsten silicide, or titanium silicide. The metal containing portion 473 may be a metallic nitride such as tantalum nitride, titanium nitride, or aluminum nitride, or may be a metallic carbide. The metal containing portions 163 and 173 are arranged in order to lower the resistance of the peripheral transistor portion PMT and the contact plug 503. The metal containing portion 473 is arranged in. order to lower the resistance of a contact plug (not illustrated) on the gate electrode 47. The metal containing portion may be arranged for another purpose. For example, the metal containing portion may be arranged as a metal gate for the gate electrode, or may be arranged as a shielding member for the semiconductor substrate 10.

A side wall spacer 48 of the gate electrode 47 is arranged to cover the side face of the gate electrode 47. The side wall spacer 48 is a multi-layer member including a silicon nitride layer 483 and a silicon oxide layer 482. The silicon oxide layer 482 is disposed between the silicon nitride layer 483 and the side face of the gate electrode 47, and between the silicon nitride layer 483 and the semiconductor substrate 10 (semiconductor areas 171 and 161). The semiconductor areas 161 and 171 are disposed under the side wall spacer 48, and the semiconductor areas 162 and 172 are disposed under the metal containing portion Contact plugs 501, 502, and 503 which penetrate the interlayer insulation film 40 are arranged above the semiconductor substrate 10. The contact plug 503 also penetrates the silicon nitride layer 32 in addition to the interlayer insulation film 40. The contact plugs 501, 502 and 503 are conductive members including a barrier metal such as titanium nitride and a conductive material such as tungsten. The contact plug 503 is connected to the source 16 and the drain 17, and the contact plug 504 is connected to the gate electrode 47. The contact plug 503 is in contact with the metal containing portions 163 and 173. Although the metal containing portions 163, 173, and 473 are respectively arranged on the source 16, the drain 17, and the gate electrode 47 of the peripheral transistor portion PMT, only one of the metal containing portions 163, 173, and 473 may be arranged.

A photodiode, for example, may be used as the photoelectric conversion portion 11 arranged on the semiconductor substrate 10. The photoelectric conversion portion 11 includes an N-type semiconductor area 111 as an electric charge accumulation area (i.e., cathode) and a P-type semiconductor area 112 as a well area (i.e., anode) arranged at a position deeper than the position of the semiconductor area 111 in the semiconductor substrate 10. The photoelectric conversion portion 11 includes a P-type semiconductor area 113 as a surface separation area arranged between the semiconductor area 111 and a surface of the semiconductor substrate 10. With the semiconductor area 112, the photoelectric conversion portion 11 serves as an embedded photodiode.

The gate electrode 42 of the pixel transistor is arranged above the semiconductor substrate 10. A gate insulation film 24 between the gate electrode 42 and the semiconductor substrate 10 may be thicker than the gate insulation film 26 of the peripheral transistor portion PMT. An electric charge detection portion 12 serves as a floating diffusion. The contact plug 501 is connected to the electric charge detection portion 12, and. the contact plug 502 is connected to the gate electrode 42.

The semiconductor apparatus APR includes a silicon nitride layer 31 arranged above the semiconductor substrate 10. The silicon nitride layer 31 is arranged above the photoelectric conversion portion 11 to occupy a portion between the interlayer insulation film 40 and the semiconductor substrate 10. A thickness 131 of the silicon nitride layer 31 may be 0.95 times or less, or 1.05 times or more than the thickness T32 of the silicon nitride layer 32. The silicon nitride layer 31 arranged above the photoelectric conversion portion 11 can function itself as a protection layer to reduce damage or contamination of the photoelectric conversion portion 11 at the time the photoelectric conversion apparatus APR is manufactured or used. By differentiating the thickness T31 of the silicon nitride layer 31 from the thickness T32 of the silicon nitride layer 32, the thickness T31 of the silicon nitride layer 31 can be optimized to protect the photoelectric conversion portion 11 or to improve an optical characteristic thereof.

The semiconductor apparatus APR further includes at least one of a silicon oxide layer 22, a silicon nitride layer 33, and a silicon oxide layer 23, arranged above the semiconductor substrate 10. In the present exemplary embodiment, although the semiconductor apparatus APR includes all of the above three layers 22, 33, and 23, it is particularly preferable that the silicon nitride layer 33 from among the three layers 22, 33, and 23 be arranged thereon. The contact plugs 501 and 502 also penetrate the silicon nitride layer 33 in addition to the interlayer insulation film 40. The silicon nitride layer 33 disposed between the semiconductor substrate 10 and the interlayer insulation film 40 is arranged above the photoelectric conversion portion 11. For example, the thickness 133 of the silicon nitride 33 is 10 to 100 nm. A thickness 133 of the silicon nitride layer 33 may be 0.95 times or more and 1.05 times or less than the thickness T38 of the silicon nitride layer 38. The silicon nitride layer 33 is arranged between the silicon oxide layer 22 and the photoelectric conversion portion 11. The silicon oxide layer 22 is arranged between the silicon nitride layer 31 and the silicon nitride layer 33. The silicon oxide layer 22 is arranged between he semiconductor substrate 10 and the silicon nitride layer 33. In the pixel area PX, an insulation film 49 as a multi-layer film including the silicon oxide layer 22, the silicon nitride layer 33, and the silicon oxide layer 23 covers the semiconductor substrate 10 and the gate electrode 42. By arranging the insulation film 49 including the silicon oxide layer 22, the silicon nitride layer 33, and the silicon oxide layer 23, an optical characteristic such as a reflectance on the photoelectric conversion portion 11 can be improved. By reducing a difference between the thickness of the silicon nitride layer 33 that covers the gate electrode 42 and the thickness of the silicon nitride layer 38 that covers the conductive member 45, a difference between heights thereof can be reduced, and flatness of the interlayer insulation film 40 in the entirety of the semiconductor apparatus APR can be improved. With this configuration, a short circuit caused by a residue arising at the time of forming the contact plugs 501 to 507 or the wiring layer 51 can be suppressed, and reliability of the semiconductor apparatus APR can be improved.

<Manufacturing Method of Semiconductor Apparatus>

A manufacturing method of the semiconductor apparatus APR will be described with reference to FIGS. 3A to 3C and FIGS. 4A to 4C.

In a process A illustrated in FIG. 3A, a polycrystalline silicon film is formed above the semiconductor substrate 10 on which the insulation member 9 for isolating the elements is formed. The semiconductor substrate 10 may be a silicon wafer. The polycrystalline silicon film is formed into the polycrystalline silicon layer 450 and the gate electrode 47 through patterning. In addition, an amorphous silicon film may be formed instead of the polycrystalline silicon film, and the amorphous silicon may be denatured into the polycrystalline silicon through thermal processing after patterning.

Then, P-type impurities (boron) are introduced to the polycrystalline silicon layer 450. By introducing boron to the polycrystalline silicon layer 450, the resistivity of the polycrystalline silicon layer 450 can be lowered to the resistivity appropriate for using the polycrystalline silicon layer 450 as a resistor. For example, a dose amount of boron introduced to the polycrystalline silicon layer 450 is $5 \times 10^{14}$ to $5 \times 10^{15}$ ions/cm$^2$.

Further, the gate electrode 47 is used as a mask, and the semiconductor areas 161 and 171 are formed by implanting ion. into the semiconductor substrate 10. For example, dose amount of boron for forming the semiconductor areas 161 and 171 may be $1 \times 10^{14}$ to $1 \times 10^{15}$ ions/cm$^2$. The dose amount for forming the semiconductor areas 161 and 171 in the process A can be less than the dose amount of boron introduced to the polycrystalline silicon layer 450 in the process A. Impurities may be introduced to the gate electrode 47 when the semiconductor areas 161 and 171 are formed. On the other hand, when the semiconductor areas 161 and 171 are formed, the first portion 451, the second portion 452, and the third portion 453 of the polycrystalline silicon layer 450 can be masked with a resist, so that impurities will not be introduced thereto.

In a process B illustrated FIG. 3B, an insulation film 490 is formed to cover the polycrystalline silicon layer 450 and the gate electrode 47. The insulation film 490 is a multi-layer film including a silicon oxide layer 220, a silicon nitride layer 330 between the silicon oxide layer 220 and the semiconductor substrate 10, and a silicon oxide layer 230 between the silicon nitride layer 330 and the semiconductor substrate 10. Respective layers 330, 220, and 230 of the insulation film 490 can formed by a thermal chemical vapor deposition (CVD) method.

In a process C illustrated in FIG. 3C, the patterning is performed on the insulation film 490. With this processing, an insulation film 18 is formed on the polycrystalline silicon layer 450 from the insulation film 490. The insulation film 18 is formed by removing a portion of the insulation film 490 disposed above the first portion 451 and the second portion 452 of the polycrystalline silicon layer 450. In addition, the side wall 19 that covers the side face of the polycrystalline silicon layer 450 is formed from the insulation film 490. Further, a side wall spacer 48 is formed from the insulation film 490. Furthermore, the insulation film 49 (not illustrated) arranged above the photoelectric conversion portion 11 (not illustrated) is formed from the insulation film 490. In this process C, one portion 481 of the silicon oxide layer 220 may remain above the side wall spacer 48 or the side wall 19.

Then, the gate electrode 47 or the side wall spacer 48 is used as a mask, and the semiconductor areas 162 and 172 are formed by implanting ion into the semiconductor substrate 10. For example, a dose amount of boron for forming the semiconductor areas 162 and 172 may be $1 \times 10^{15}$ to $1 \times 10^{16}$ ions/cm$^2$. The dose amount for forming the semiconductor areas 162 and 172 in the process C can be greater than the dose amount of boron introduced to the polycrystalline silicon layer 450 in the process A. While impurities may be introduced to the gate electrode 47 when the semiconductor areas 162 and 172 are formed, the first portion 451 and the second portion 452 of the polycrystalline silicon layer 450 can be masked with a resist so that impurities will not be introduced thereto.

In a process D illustrated in FIG. 4A, a metallic film (not illustrated) is formed above the semiconductor substrate 10. Silicide portions 456 and 457 are formed by causing the metallic film to react with the semiconductor substrate 10, the polycrystalline silicon layer 450, and the polycrystalline silicon portion of the gate electrode 47 through thermal processing. Further, the metal containing portions 163, 173, and 473 are formed. As described above, in the process D, self-aligned silicide (SALICIDE) processing is executed to form the insulation films 18 and 49 from the insulation film 490 while the side wall spacer 48, and the side wall 19 serve as silicide blockers. Because the silicon nitride layer is included in the silicide blocker, diffusion of metal from the metallic film can be suppressed in comparison to the case where the silicide blocker is configured of only the silicon oxide layer without the silicon nitride layer. Therefore, metallic contamination of the semiconductor substrate 10 or the polycrystalline silicon layer 450 and lowering of resistivity caused by metal can be suppressed.

After the suicide portions 456 and 457 are formed, an unreacted metallic film is removed. When the metallic film is removed, one portion 481 of the silicon oxide layer 220 remaining above the side wall spacer 48 or the side wall 19 can be removed.

In a process E illustrated in FIG. 4B, a silicon nitride film is formed on an entire face of the semiconductor substrate 10 through a plasma CVD method. The silicon nitride layer 32 is formed from the silicon nitride film formed in the process E. Patterning may be performed on this silicon nitride film as necessary, and the silicon nitride film is removed from the pixel area PX. Although damage caused by plasma may occur in the conductive member 45 because the silicon nitride film is formed by employing the plasma CVD method in the process E, the damage caused by the plasma is reduced because the conductive member 45 is protected by the silicon nitride layer 38. Therefore, reliability of the conductive member 45 can be improved. The silicon nitride film formed by the plasma CVD method contains more hydrogen in comparison to the silicon nitride film formed by the thermal CVD method. On the other hand, the silicon nitride film formed by the thermal CVD method is less likely to transmit hydrogen in comparison to the silicon nitride film formed by the plasma CVD method. There is a case where hydrogen contained in the silicon nitride film causes the resistance value of the conductive member 45 to fluctuate. However, because the conductive member 45 is protected by the silicon nitride layer 38 formed by the thermal CVD method, supply of hydrogen from the silicon nitride layer 32 to the conductive member 45 can be suppressed. Therefore, the resistance value of the conductive member 45 can be stabilized.

In a process F illustrated in FIG. 4C, the interlayer insulation film 40 is formed above the silicon nitride layer 32, and the interlayer insulation film 40 is planarized. Then, contact holes 403, 406, and 407 are formed by applying etching on the interlayer insulation film 40 and the silicon nitride layer 32. The contact holes 403, 406, and 407 are holes formed on the interlayer insulation film 40 and the silicon nitride layer 32, which expose a conductive material such as polycrystalline silicon or silicide, or a semiconductor material in the semiconductor area of the semiconductor substrate 10. When the contact holes 403, 406, 407 are formed on the interlayer insulation film 40, the silicon nitride layer 32 functions as an etching stopper with respect to the etching applied on the interlayer insulation film 40. By arranging the silicon nitride layer 32 in a vicinity of the conductive member 45, precision of depth of the contact holes 406 and 407 can be increased. With this configuration, damage to the conductive member 45 at the time of forming the contact hole 406 or 407, and decrease of a yield rate caused by a lack of depth of the contact hole 406 or 407 can be suppressed. Different from the present exemplary embodiment, in a case where contact holes are formed by penetrating the silicon nitride layers 32 and 38, a condition for applying etching has to be switched before and after the etching is applied on the silicon nitride layers 32 and 38 when the etching is applied on the silicon oxide layers. Therefore, manufacturing process thereof will be complicated, and thus reliability of the apparatus or a manufacturing yield rate may decrease. On the contrary, by making the width of the silicon nitride layer 38 in the X-direction shorter than the width of the conductive member 45 in the X-direction, etching does not have to be applied on the silicon nitride layer 38 when the contact hole 406 or 407 is formed. Therefore, complicated formation process of the contact hole 406 or 407 can be avoided, and reliability of the apparatus the manufacturing yield rate can be improved.

Thereafter, as illustrated. in FIG. 2A, the contact plugs 503, 506, and 507 are formed on the contact holes 403, 406, and 407. Further, a multi-layer wiring structure including the wiring layer 51, a color filter array, and a microlens array are formed. Then, the wafer is diced into chips, and the chips are sealed through packaging processing. Thus, the semiconductor apparatus APR as a photoelectric conversion apparatus can be manufactured.

<Equipment Including Semiconductor Apparatus>

The equipment EQP illustrated in FIG. 1A will be described in detail. In addition to the semiconductor device IC including the semiconductor substrate 10, the semiconductor apparatus APR can include a package PKG for containing a semiconductor device IC. The package PKG includes a substrate on which the semiconductor device IC is fixed, a cover material such as glass which faces the semiconductor device IC, and a connection member such as a bonding wire or a bump for connecting a terminal provided on the substrate with a terminal provided on the semiconductor device IC.

The equipment EQP can further include at least one of the optical system OPT, the control device CTRL, the processing device PRCS, the display device DSPL, and the storage device MMRY. The optical system OPT may be a lens, a shutter, or a mirror which forms an image on the semiconductor apparatus APR as a photoelectric conversion apparatus. The control device CTRL may be a semiconductor device such as an application specific integrated circuit (ASIC) which controls the semiconductor apparatus APR. The processing device PRCS processes a signal output from the semiconductor apparatus APR. The processing device PRCS is a semiconductor device such as a central processing unit (CPU) or an for constituting an analog front end (AFE) or a digital front end (DFE). The display device DSPL is an electroluminescence (EL) display device or a liquid crystal display device which displays information (image) acquired by the semiconductor apparatus APR. The storage device MMRY is a magnetic device or a semiconductor device which stores information (image) acquired by the semiconductor apparatus APR. The storage device MMRY may be a volatile memory such as a static random access memory (SRAM) or a dynamic random access memory (DRAM), or may be a non-volatile memory such as a flash memory or a hard disk drive. The mechanical device MCHN includes a moving unit or a driving unit such as a motor or an engine. The equipment EQP displays a signal output from the semiconductor apparatus APR on the display device DSPL, or externally transmits the signal through a communication device (not illustrated) included in the equipment EQP. Therefore, it is preferable that the equipment EQP further include the storage device MMRY and the processing device PRCS in addition to a memory circuit or an arithmetic circuit included in the semiconductor apparatus APR.

The equipment EQP illustrated in FIG. 1A may be an electronic device such as an information terminal having an imaging function (e.g., a smartphone or a wearable terminal) or a camera (e.g., an interchangeable-lens camera, a compact camera, a video camera, or a monitoring camera). The mechanical device MCHN in the camera can drive components of the optical system OPT in order to execute zooming, focusing, or shutter operation. Further, the equipment EQP may be a transportation equipment (moving body) such as a vehicle, a vessel, or a flight vehicle. The mechanical device MCHN in the transportation equipment is used as a moving device. The equipment EQP as transport equipment in which the semiconductor apparatus APR is installed, preferably used for equipment that aids and/or automates a driving (steering) operation through an imaging function. The processing device PRCS for aiding and/or automating the driving (steering) operation can execute processing for operating the mechanical device MCH as a moving device based on the information acquired by the semiconductor apparatus APR.

By using the semiconductor apparatus APR according to the present exemplary embodiment, reliability can be improved. Therefore, excellent image quality or measurement precision can be obtained when imaging of an external view from the transportation equipment, or measurement of an external environment is executed by installing the semiconductor apparatus APR on the transportation equipment. Further, it is possible to achieve the sufficient reliability of the semiconductor apparatus APR to be installed on the equipment such as a transportation equipment used in a severe environment. Therefore, in terms of manufacturing and distribution of the transportation equipment, the semiconductor apparatus APR of the present exemplary embodiment can be advantageously installed to the transportation equipment to improve the performance of the transportation equipment.

Variations or improvements which do not depart from the technical spirit of aspects of the present disclosure may be applied as appropriate with respect to the above-described exemplary embodiment. Furthermore, disclosure of the exemplary embodiment is not limited to the content described in this specification document, and all of matters graspable from the specification document and the appended drawings should be included within the scope of the present disclosure.

While aspects of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-135607, filed Jul. 11, 2017, which is hereby incorporated by reference herein in its entirety.

What is claimed is:

1. A semiconductor apparatus comprising:
   a semiconductor substrate;
   a conductive member which is arranged above the semiconductor substrate and which includes a polycrystalline silicon layer having a first portion, a second portion, and a third portion between the first and the second portions in a direction extending along a main surface of the semiconductor substrate;
   an interlayer insulation film that covers the conductive member;
   a first silicon nitride layer arranged between the interlayer insulation film and the third portion;
   a second silicon nitride layer arranged between the interlayer insulation film and the first portion, and between the interlayer insulation layer and the second portion;
   a first contact plug disposed above the first portion, the first contact plug penetrating the interlayer insulation film and the second silicon nitride layer to connect to the conductive member; and
   a second contact plug disposed above the second portion, the second contact plug penetrating the interlayer insulation film and the second silicon nitride layer to connect to the conductive member,
   wherein the first silicon nitride layer is disposed between the first contact plug and the second contact plug in the direction and apart from the first contact plug and the second contact plug,
   wherein a direction in which the first portion, the second portion, and the third portion are arrayed, is set as a first direction, and a direction extending along the main surface of the semiconductor substrate, which intersects with the first direction, is set as a second direction, and
   wherein the first silicon nitride layer is extended and disposed to cover a side surface of the polycrystalline silicon layer in the second direction.

2. The semiconductor apparatus according to claim 1, wherein the first silicon nitride layer is disposed between the second silicon nitride layer and the conductive member.

3. The semiconductor apparatus according to claim 1, wherein the second silicon nitride layer includes an area disposed between the interlayer insulation film and the third portion.

4. The semiconductor apparatus according to claim 3, wherein a distance between the first silicon nitride layer and the conductive member is shorter than a distance between the first silicon nitride layer and the area.

5. The semiconductor apparatus according to claim 1,
   wherein a first silicon oxide layer is arranged between the first silicon nitride layer and the polycrystalline silicon layer,
   wherein a second silicon oxide layer is arranged between the first silicon nitride layer and the second silicon nitride layer, and
   wherein the first silicon oxide layer is in contact with the polycrystalline silicon layer.

6. The semiconductor apparatus according to claim 1, wherein the second silicon nitride layer is disposed between the first silicon nitride layer and the first contact plug and between the first silicon nitride layer and the second contact plug.

7. The semiconductor apparatus according to claim 1,
   wherein the conductive member includes a first silicide portion arranged between the polycrystalline silicon layer and the first contact plug and a second silicide portion arranged between the polycrystalline silicon layer and the first contact plug, and
   wherein the first silicide portion and the second silicide portion are extended and disposed between the second silicon nitride layer and the polycrystalline silicon layer.

8. The semiconductor apparatus according to claim 7, wherein the second silicon nitride layer is in contact with the first silicide portion and the second silicide portion.

9. The semiconductor apparatus according to claim 1, wherein a side wall including a silicon nitride layer which covers a side surface of the polycrystalline silicon layer is arranged above the semiconductor substrate.

10. The semiconductor apparatus according to claim 9, wherein the second silicon nitride layer is in contact with the silicon nitride layer of the side wall.

11. The semiconductor apparatus according to claim 1,
    wherein a direction in which the first portion, the second portion, and the third portion are arranged, is set as a first direction, and a direction extending along the main surface of the semiconductor substrate and intersecting with the first direction is set as a second direction, and
    wherein a first plurality of contact plugs including the first contact plug are disposed above the first portion, the first plurality of contact plugs penetrate the interlayer insulation film and the second silicon nitride layer to connect to the conductive member, the first plurality of contact plugs are arrayed in the second direction, and wherein a second plurality of contact plugs including the second contact plug are disposed above the second portion, the second plurality of contact plugs penetrate the interlayer insulation film and the second silicon nitride layer to connect to the conductive member, the second plurality of contact plugs are arrayed in the second direction.

12. The semiconductor apparatus according to claim 1, wherein the polycrystalline silicon layer contains boron, wherein a gate electrode of a transistor is arranged above the semiconductor substrate, wherein the gate electrode includes a polycrystalline silicon portion, and wherein a boron concentration of the polycrystalline silicon layer is lower than a boron concentration of the polycrystalline silicon portion.

13. The semiconductor apparatus according to claim 1, wherein the semiconductor substrate is provided with a photoelectric conversion portion.

14. The semiconductor apparatus according to claim 13, wherein a third silicon nitride layer having a portion disposed between the semiconductor substrate and the interlayer insulation film, is arranged above the photoelectric conversion portion, and wherein a thickness of the third silicon nitride layer is 0.95 times or more, and 1.05 times or less than a thickness of the first silicon nitride layer.

15. The semiconductor apparatus according to claim 13, wherein a fourth silicon nitride layer having a portion disposed between the semiconductor substrate and the interlayer insulation film is arranged above the photoelectric conversion portion, and wherein a thickness of the fourth silicon nitride layer is 0.95 times or less, or 1.05 times or more than a thickness of the second silicon nitride layer.

16. An equipment comprising:

the semiconductor apparatus according to claim 13;

wherein the equipment further includes at least one of
an optical system for forming an image on the semiconductor apparatus,
a control device for controlling the semiconductor apparatus, a processing device for processing a signal output from the semiconductor apparatus,
a mechanical device controlled based on information acquired by the semiconductor apparatus,
a display device for displaying information acquired by the semiconductor apparatus, and
a storage device for storing information acquired by the semiconductor apparatus.

17. A semiconductor apparatus comprising:

a semiconductor substrate;

a conductive member which is arranged above the semiconductor substrate and which includes a polycrystalline silicon layer having a first portion, a second portion, and a third portion between the first and the second portions in a direction extending along a main surface of the semiconductor substrate;

an interlayer insulation film that covers the conductive member;

a first silicon nitride layer arranged between the interlayer insulation film and the third portion;

a second silicon nitride layer arranged between the interlayer insulation film and the first portion, and between the interlayer insulation layer and the second portion;

a first contact plug disposed above the first portion, the first contact plug penetrating the interlayer insulation film and the second silicon nitride layer to connect to the conductive member; and a second contact plug disposed above the second portion, the second contact plug penetrating the interlayer insulation film and the second silicon nitride layer to connect to the conductive member, wherein the first silicon nitride layer is disposed between the first contact plug and the second contact plug in the direction and apart from the first contact plug and the second contact plug, and wherein a distance between the second silicon nitride layer and the conductive member is shorter than a distance between the first silicon nitride layer and the conductive member.

18. The semiconductor apparatus according to claim 17, wherein the polycrystalline silicon layer contains boron, wherein a gate electrode of a transistor is arranged above the semiconductor substrate, wherein the gate electrode includes a polycrystalline silicon portion, and wherein a boron concentration of the polycrystalline silicon layer is lower than a boron concentration of the polycrystalline silicon portion.

19. A semiconductor apparatus comprising:

a semiconductor substrate;

a conductive member which is arranged above the semiconductor substrate and which includes a polycrystalline silicon layer having a first portion, a second portion, and a third portion between the first and the second portions in a direction extending along a main surface of the semiconductor substrate;

an interlayer insulation film that covers the conductive member;

a first silicon nitride layer arranged between the interlayer insulation film and the third portion;

a second silicon nitride layer arranged between the interlayer insulation film and the first portion, and between the interlayer insulation layer and the second portion;

a first contact plug disposed above the first portion, the first contact plug penetrating the interlayer insulation film and the second silicon nitride layer to connect to the conductive member; and a second contact plug disposed above the second portion, the second contact plug penetrating the interlayer insulation film and the second silicon nitride layer to connect to the conductive member, wherein the first silicon nitride layer is disposed between the first contact plug and the second contact plug in the direction and apart from the first contact plug and the second contact plug, wherein an insulation member thicker than the first silicon nitride layer is arranged between the conductive member and the semiconductor substrate, and wherein the second silicon nitride layer is extended and disposed to cover an edge of the insulation member in the direction extending along the main surface.

20. The semiconductor apparatus according to claim 19, wherein a direction in which the first portion, the second portion, and the third portion are arrayed, is set as a first direction, and a direction extending along the main surface of the semiconductor substrate, which intersects with the first direction, is set as a second direction, and wherein the first silicon nitride layer is extended and disposed to cover a side surface of the polycrystalline silicon layer in the second direction.

\* \* \* \* \*